(12) United States Patent
Primavera et al.

(10) Patent No.: US 7,226,821 B2
(45) Date of Patent: Jun. 5, 2007

(54) FLIP CHIP DIE ASSEMBLY USING THIN FLEXIBLE SUBSTRATES

(75) Inventors: Anthony A. Primavera, Anoka, MN (US); Vijesh Unnikrishnan, Minneapolis, MN (US); David J. Smith, Edina, MN (US)

(73) Assignee: Cardiac Pacemakers, Inc., St. Paul, MN (US)

( * ) Notice: Subject to any disclaimer, the term of this patent is extended or adjusted under 35 U.S.C. 154(b) by 0 days.

(21) Appl. No.: 11/166,461

(22) Filed: Jun. 24, 2005

(65) Prior Publication Data

US 2006/0292756 A1     Dec. 28, 2006

(51) Int. Cl.
*H01L 21/00*     (2006.01)

(52) U.S. Cl. .................. 438/149; 257/E21.703

(58) Field of Classification Search .............. 438/6, 438/10, 104, 107–114, 121–123, 128–129, 438/135, 142, 145, 149, 151, 157, 176, 478, 438/184, 193, 195–198, 200–203, 206–207, 438/209–211, 218, 237, 165, 248, 268, 343, 438/294, 308
See application file for complete search history.

(56) References Cited

U.S. PATENT DOCUMENTS

| | | | |
|---|---|---|---|
| 4,980,219 A | | 12/1990 | Hiraide et al. |
| 5,877,043 A | * | 3/1999 | Alcoe et al. ............ 438/123 |
| 6,015,722 A | | 1/2000 | Banks et al. |
| 6,020,218 A | | 2/2000 | Shim et al. |
| 6,060,341 A | * | 5/2000 | Alcoe et al. ............ 438/123 |
| 6,080,603 A | | 6/2000 | Distefano et al. |

(Continued)

FOREIGN PATENT DOCUMENTS

EP     1 204 137 A2     5/2002

(Continued)

OTHER PUBLICATIONS

International Search Report for International application No. PCT/US2006/024399 mailed Oct. 16, 2006.

(Continued)

*Primary Examiner*—Michael Lebentritt
*Assistant Examiner*—André Stevenson
(74) *Attorney, Agent, or Firm*—Faegre & Benson LLP

(57) ABSTRACT

Apparatus and methods for flattening thin substrate surfaces by stretching thin flexible substrates to which ICs can be bonded. Various embodiments beneficially maintain the substrate flatness during the assembly process through singulation. According to one embodiment, the use of a window frame type component carrier allows processing of thin laminates and flex films through various manufacturing processes. The flexible substrate is bonded to a rigid carrier. The carrier is placed into a specialized fixture comprising a bottom plate and a top plate. The bottom plate with raised regions is created that allows the windowed region of the flex film to be pressed flat. After aligning the top plate, the bottom plate, and the middle structure, the plates are pressed together causing the raised regions to push the flex film substrate upward and around the carrier. By pressing the thin substrate upward, the substrate is stretched like a drum head over the raised sections of the bottom plate, thereby flattening the substrate. The die assembly site is held flat overtop of the raised portion of the carrier to provide a stable vase for placement of the die.

7 Claims, 5 Drawing Sheets

U.S. PATENT DOCUMENTS

| | | | |
|---|---|---|---|
| 6,711,312 B1 | 3/2004 | Kornrumpf et al. | |
| 6,780,747 B2 | 8/2004 | Distefano et al. | |
| 2001/0006252 A1 | 7/2001 | Kim et al. | |
| 2001/0052642 A1 | 12/2001 | Wood et al. | |
| 2002/0090749 A1* | 7/2002 | Simmons | 438/64 |
| 2002/0110956 A1 | 8/2002 | Kumamoto et al. | |
| 2002/0114144 A1 | 8/2002 | Kumamoto et al. | |
| 2003/0166312 A1 | 9/2003 | Lee | |
| 2003/0176014 A1* | 9/2003 | Hofmann | 438/106 |
| 2004/0053443 A1 | 3/2004 | Kumamoto et al. | |
| 2004/0117985 A1 | 6/2004 | Chung et al. | |
| 2004/0197955 A1* | 10/2004 | Lee | 438/108 |
| 2004/0201390 A1 | 10/2004 | Farnworth et al. | |
| 2004/0207052 A1 | 10/2004 | Joshi et al. | |
| 2005/0201670 A1* | 9/2005 | Uchiyama | 385/14 |
| 2006/0134813 A1* | 6/2006 | Wei et al. | 438/26 |
| 2006/0134922 A1* | 6/2006 | Taussig et al. | 438/739 |
| 2006/0160278 A1* | 7/2006 | Mei | 438/149 |

FOREIGN PATENT DOCUMENTS

| | | |
|---|---|---|
| JP | 2000-260814 | 9/2000 |
| JP | 2002-009108 | 1/2002 |
| JP | 2003-124256 | 4/2003 |
| JP | 2003-297879 | 10/2003 |
| JP | 2004-039802 | 2/2004 |

OTHER PUBLICATIONS

Written Opinion of the International Searching authority for International application No. PCT/US2006/024399.

* cited by examiner

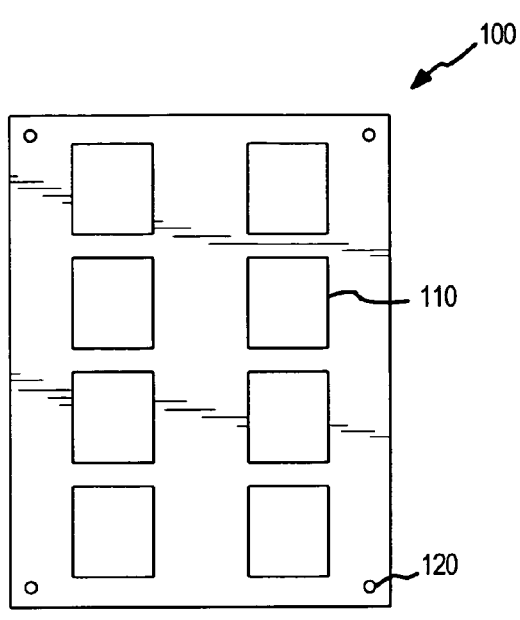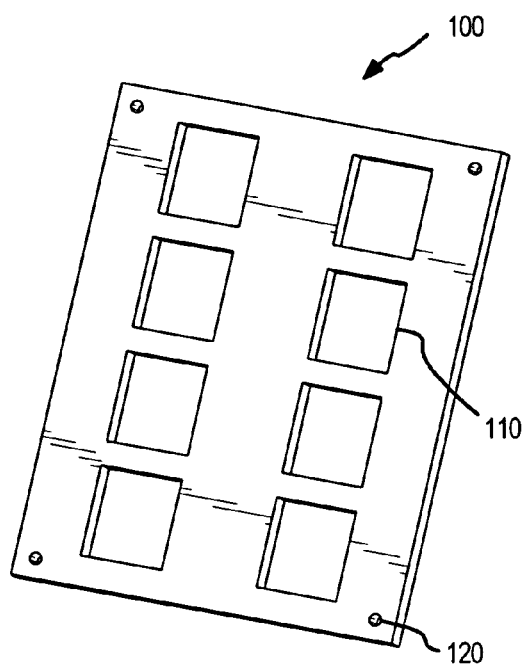
FIG.1a   FIG.1b
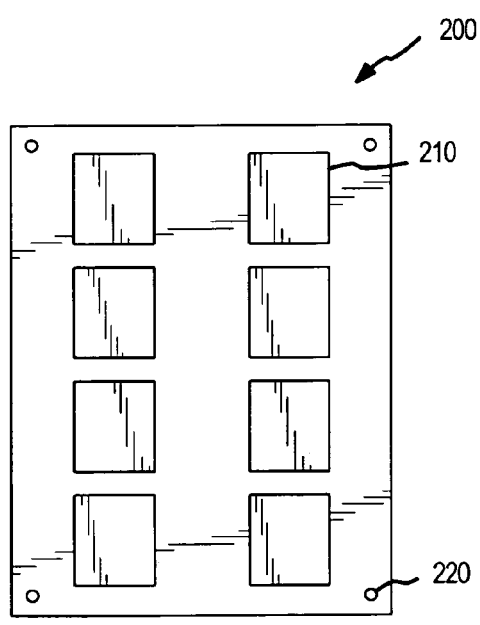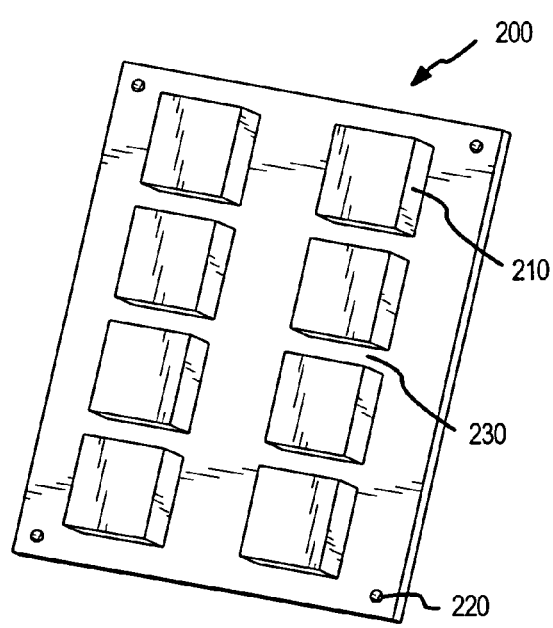
FIG.2a   FIG.2b

FLIP CHIP DIE ASSEMBLY USING THIN FLEXIBLE SUBSTRATES

TECHNICAL FIELD

Various embodiments of the present invention generally relate to apparatus and methods for assembling flip chip dies with thin flexible substrates. More specifically, embodiments relate to apparatus and methods flattening thin substrate surfaces by stretching thin flexible substrates to which ICs can be bonded.

BACKGROUND

Traditionally, three approaches have been employed for connecting integrated circuits (ICs) to printed circuit boards. These approaches are wire bonding, chip carriers with beam leads, and direct chip connections. Flip chip technology is one of the direct chip connection approaches. In general, a flip chip assembly forms a direct electrical connection between an electronic component and a substrate, circuit board, or carrier, by means of conductive bumps on chip bond pads of the electronic component.

Flip chip technology has been used since the early 1960's. Compared to other packaging methods, flip chip technology provides increased performance in several areas, such as smaller package sizes, increased performance in high frequency applications, improved thermal capabilities, more I/O connections on a smaller die, and increased reliability. With these advantages, flip chip technology has found applications in the computer industry, automotive applications, electronic watches, cellular phones, pagers, and the like.

There is a constant push in the industry to achieve smaller die packages. Unfortunately, traditional flip chip assembly techniques have characteristics that limit the minimum thickness that can be achieved. One problem relates to the common use of the relatively thick, rigid polymer substrates. With the current technologies, by bonding of the silicon ICs to a rigid polymer substrate, devices currently in commercial production are on the order of 1 millimeter (mm) in thickness.

Flexible polymer substrates have been used in some approaches. However, previous direct chip connection approaches using thin flexible polymer substrates have typically been unsuccessful. One problem relates to uneven surfaces common to flexible polymer substrates. Such flexible substrates do not have the proper flatness for accurately bonding ICs using surface mount technologies (e.g., flip chip) with traditional approaches to die assembly. Because the polymers are so thin, it is difficult to manufacture polymers having sufficiently flat surfaces.

Hence, there exists a need in the art for apparatus and methods for flattening the thin flexible substrates to facilitate accurate bonding of ICs with the substrate.

SUMMARY

Various embodiments of the present invention include apparatus and methods for assembling flip chip dies including thin substrate surfaces. In some embodiments, the flip chip die is assembled by stretching thin flexible substrates to which ICs can be bonded. Stretching can be performed using embodiments of a top plate and bottom plate, with the flexible substrate disposed therebetween. Compressing the flexible substrate between the top plate and the bottom plate stretches portions of the flexible substrate over the raised sections of the bottom plate.

In a particular embodiment of an apparatus, the top plate and bottom plate are positioned such that each raised section of the bottom plate is opposite an aperture of the top plate. The middle plate is positioned between the top and bottom plate in manner such that the carrier portions are above the network of channels created by the raised sections of the bottom plate. The top plate is then pressed down on the middle structure toward the bottom plate resulting in portions of the substrate to stretch over the raised sections of the bottom plate.

A more complete understanding may be derived by referring to the detailed description of preferred embodiments and claims when considered in connection with the figures.

While multiple embodiments are disclosed, still other embodiments of the present invention will become apparent to those skilled in the art from the following detailed description, which shows and describes illustrative embodiments of the invention. As will be realized, the invention is capable of modifications in various obvious aspects, all without departing from the spirit and scope of the present invention. Accordingly, the drawings and detailed description are to be regarded as illustrative in nature and not restrictive.

BRIEF DESCRIPTION OF THE DRAWINGS

In the Figures, similar components and/or features may have the same reference label. Further, various components of the same type may be distinguished by following the reference label with a second label that distinguishes among the similar components. If only the first reference label is used in the specification, the description is applicable to any one of the similar components having the same first reference label irrespective of the second reference label.

FIG. 1a is a plan view of a top plate in accordance with one embodiment of the present invention;

FIG. 1b illustrates the top plate of FIG. 1a from another perspective;

FIG. 2a is a plan view of a bottom plate in accordance with one embodiment of the present invention;

FIG. 2b illustrates the bottom plate of FIG. 2a from another perspective;

Figure 3A:
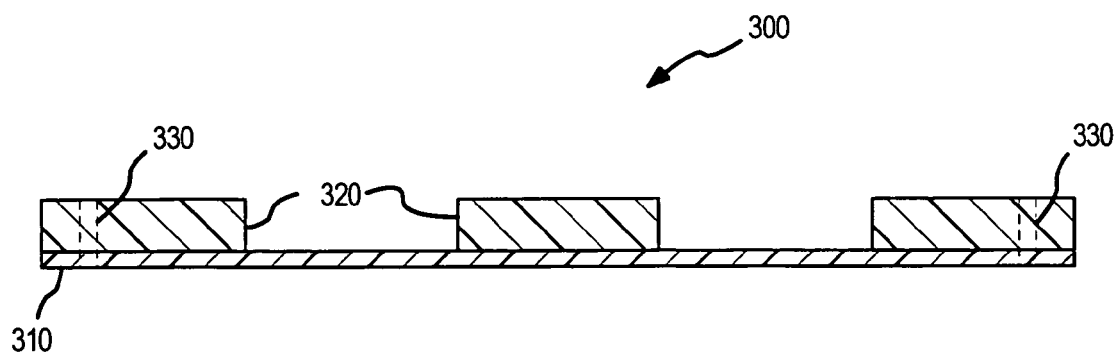
FIG. 3a is a cross-sectional view of a middle structure comprising a flexible substrate and a support frame in accordance with one embodiment of the present invention.

While the invention is amenable to various modifications and alternative forms, specific embodiments have been shown by way of example in the drawings and are described in detail below. The intention, however, is not to limit the invention to the particular embodiments described. On the contrary, the invention is intended to cover all modifications, equivalents, and alternatives falling within the scope of the invention as defined by the appended claims.

DETAILED DESCRIPTION

Apparatus and methods are described for creating thin substrate surfaces by flattening thin flexible substrates to which ICs can be bonded. Embodiments presented below generally facilitate the manufacture of thinner integrated circuits (ICs) by flatting thin flexible substrates to create a die assembly. ICs can be accurately bonded to the flattened substrate using direct connection technologies, such as surface mount (e.g., flip chip).

According to one embodiment, the flip chip assembly process generally comprises one or more of the following: (1) fabrication of the component or chip substrate; (2) fabrication of a bumped IC wafer; (3) singulation of the die from the wafer; (4) picking and inspection of die from a die feeder; (5) fluxing the die or carrier site by dipping, transfer, spray, dispensing, or brushing methods; (6) placement of the die onto the fluxed site; (7) fusing of the solder bumps to the attachment pads by reflow soldering; (8) post reflow underfill (e.g., epoxy dispensing); (9) epoxy cure; (10) solder bump attachment; (11) singulation (i.e., the cutting of a wafer into individual die); and (12) test and final processing.

In general, there are several steps typically performed to fabricate a semiconductor component. At a high level, various embodiments relate to the interconnection of the terminations on the IC with the remaining devices on the circuit board. Typically, the IC termination pads are very small and the spacing (pitch) between conducting pads is equally small. This makes direct connection to the circuit board more challenging. In addition, testing and burn in of the IC is difficult in the raw IC format and thus requires the die to be packaged in a housing of reasonable size etc. to allow testing in sockets or probe stations. Therefore, a component package is useful not only to house the IC but to allow a more robust test configuration and a larger termination pitch for easy assembly.

There are several methods to interconnect the IC with the circuit board. One way is to package the IC in an organic container (component body). The component will house the IC, protect it and allow for proper testing etc. The first level connection (between the IC and component) can be accomplished in several ways including wirebond, ribbon bond, conductive adhesives and soldering. In the soldering case, for example, the IC has solderable termination pads, onto which solder is deposited at the IC fabricator. To join the IC solder bumps with corresponding attachment pads on a conductive layer in our component a flexible film with copper circuits and attachment pads in our prototypes may be used. The flex film has a circuit pattern that allows the IC bumps to align with the component film pads.

Flux is most often utilized to clean the attachment pads and the IC bumps prior to solder joining. The flux is a resin most often made of pine tree sap (acidic) that when heated removes all oxides on the metal conductive surfaces and allows for a proper melting of the solder to occur. The flux is deposited onto the attachment pads on the flex film directly (for example fluid dispense, pin transfer, or jetting) or it can be applied the bumps on the IC by dipping the IC into a flux film. A solder paste (flux plus solder particles) may also be used to join the IC pads and circuit pads on the component. Once the flux or paste is applied, the IC is brought into contact with the component by alignment of the IC bumps and component pads in a placement machine.

The reflow process generally involves heating the assembly in a controlled profile (time and temperature) until the flux activates, oxides are removed, and the solder is melted. Once melted, the solder joins with the attachment pad surface and makes a metallurgical bond. Upon cooling, the solder solidifies and the solder interconnection is complete. Often the IC is further protected by deposition of an encapsulating material either over or in between the IC and component surface. The encapsulation process can be achieved by dispensing or jetting a liquid epoxy or by over-mold injection. Once the resin is cured, it protects the IC and component's fragile circuitry.

In addition to the primary IC, a component may have other ICs or components such as de-coupling capacitors that are required to complete the circuit. These components are typically assembled onto the component substrate prior to any molding or encapsulation process and typically utilize a solder paste process described above.

Once the component has the IC and subsequent components attached to the substrate, other features may be required to complete the functional or aesthetic aspects of the device. For example, once finished, the component will be ultimately used in building an electronic device or apparatus of some kind. Typically solderable attachment pads or bumps are provided on the component to attach the component to another circuit board. These are often applied after the IC is bonded as described above. Therefore, solder bumps or other termination processing may occur after the IC is assembled. In addition, marking of the component to identify device number, part number, etc. may be required. Those steps are often performed prior to removing or singulating the component from the flex film strip. Finally, individual components are generally singulated into single units.

Embodiments described herein beneficially maintain the substrate flatness during the assembly process through singulation. According to one embodiment, the use of a window frame type component carrier allows circuit board manufacturers to process thin laminates and flex films through their manufacturing processes. The flex film is bonded to a rigid carrier. The carrier is placed into a specialized fixture. A bottom pallet with raised regions is created that allows the windowed region of the flex film to be pressed flat. A top portion of the carrier is joined to the bottom part of the carrier such that the windowed region of the flex film is stretched (e.g., like a drum or knitting hoop). The die assembly site is held flat overtop of the raised portion of the carrier to provide a stable vase for placement of the die. The carrier retains the flex board stability during subsequent reflow processes.

Terminology

Brief definitions of terms and/or phrases used throughout this application are given below. The terms "connected" or "coupled" and related terms are used in an operational sense and are not necessarily limited to a direct connection or coupling. Thus, for example, two devices may be coupled directly, or via one or more devices. Based on the disclosure provided herein, one of ordinary skill in the art will appreciate a variety of ways in which connection or coupling exists in accordance with the aforementioned definition.

The phrases "in one embodiment," "according to one embodiment," and the like generally means the particular feature, structure, or characteristic following the phrase is included in at least one embodiment of the present invention, and may be included in more than one embodiment of the present invention. Importantly, such phrases do not necessarily refer to the same embodiment.

If the specification states a component or feature "may," "can," "could," or "might" be included or have a characteristic, property, or structure, that particular component or feature is not required to be included or have the characteristic, property, or structure.

According to some embodiments of the invention, a thin polymer substrate is first bonded to a carrier plate. The thin polymer substrate can be a polymer, such as, but not limited to, Kapton-polyimide, liquid crystal polymer (LCP), or EPTFE and can be about 0.0005 to 0.005 inches thick. The carrier is typically a rigid polymer substrate, such as FR4, and is about 0.015 to 0.125 inches thick. To flatten out the thin polymer, a press can be used, which includes a top plate and a bottom plate.

The top plate and the bottom plate of the press are generally formed from material which has a low thermal mass. In addition, the material from which the top plate 100 and bottom plate 200 are formed from should be light and capable of surviving processing temperatures on the order of 300 degrees Celsius. Thus, as just some examples, materials from which the top plate 100 and bottom plate 200 can made primarily of include, but are not limited to, aluminum, titanium and Delmat.

Referring now to FIGS. 1a–1b, one embodiment of top plate 100 in accordance with the present invention is shown. In the illustrated embodiment, top plate 100 comprises a plurality of apertures 110. The openings 110 in the top plate allow for the placement of the ICs and other components for bonding to the substrate. In the embodiment depicted, the apertures 110 form rectangles which are aligned vertically and horizontally. In other embodiments, the shape of the apertures need not be limited to rectangles. Other examples of aperture shapes include any other geometric shape or custom design. Furthermore, each aperture 110 on the top plate need not be the same shape. In yet other embodiments, the apertures 110 are not aligned vertically and horizontally.

One embodiment of the bottom plate 200 is depicted in FIGS. 2a–2b. The bottom plate includes raised regions 210. The raised regions 210 are positioned such that each raised section is aligned with an opening 110 of the top plate. Between the raised regions 210 a network of channels 230 is formed. In the illustrated embodiment, the raised sections 210 are rectangles which are aligned vertically and horizontally. The shape of the raised section 210, however, is not limited to rectangles aligned vertically and horizontally. Typically, the shape and placement of the raised sections 210 should be similar in design and placement as the openings 110 in the top plate.

Figure 3B:
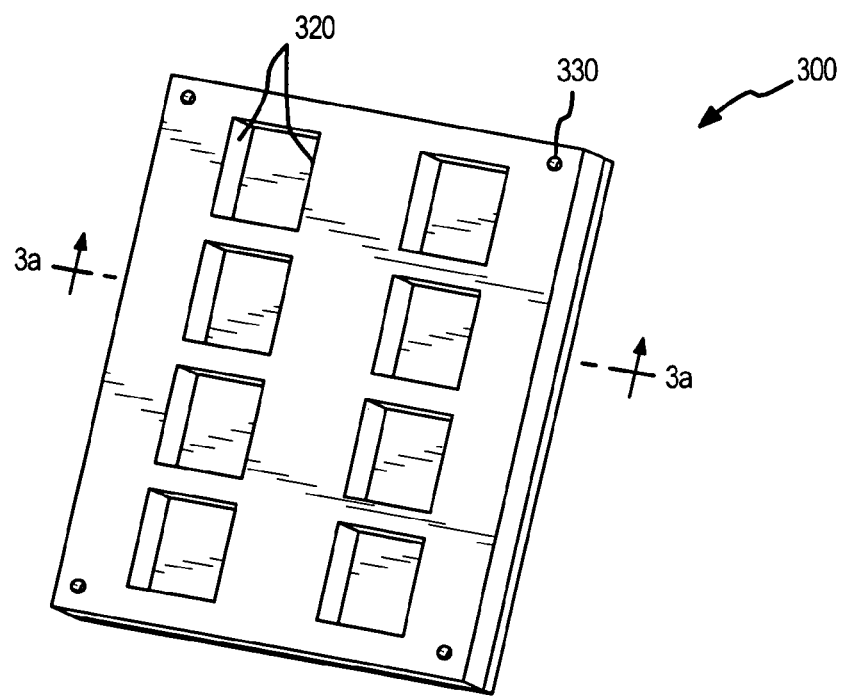
FIG. 3b illustrates the middle structure of FIG. 3a from another perspective.

FIGS. 3a–3b provide views of one embodiment of the middle structure 300. A thin flexible substrate 310 is mounted to a carrier, or support frame, 320. The carrier 320 forms a raised section capable of meshing with the network of channels 230 located on the bottom plate 200. The circuit pattern or design on the flexible substrate depends on the IC design. In this particular embodiment, the thickness of the flexible substrate 310 ranges from 0.0005 to 0.005 inches and may contain multiple layers depending on the design. Examples of primary substrate materials include, but are not limited to, polyimide, liquid crystal polymer and polytetraflouroethylene (EPTFE). The carrier 320 typically has a thickness in the range of 0.015 to 0.125 inches. The carrier is typically, but not necessarily, composed of a cheaper material such as a reinforced glass laminate (e.g. FR4).

Figure 4:
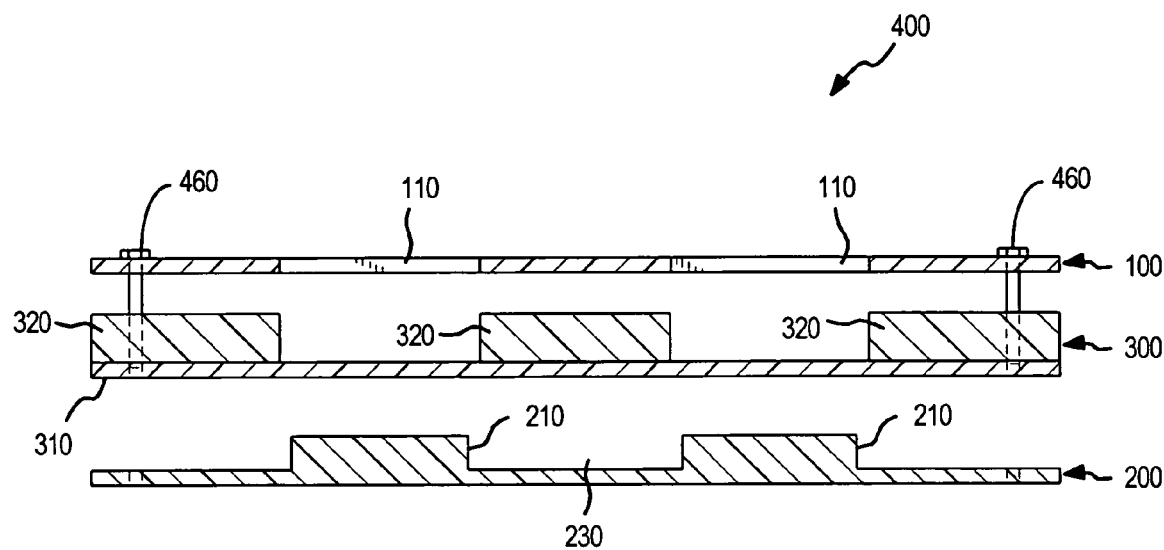
FIG. 4 is a cross-sectional view of the top plate, middle plate, and bottom plate of the assembly fixture in accordance with one embodiment of the present invention.

FIG. 4 illustrates how the top plate 100, bottom plate 200, and the middle structure 300 can be aligned in accordance with one embodiment. The top plate 100, bottom plate 200, and middle structure 300 are positioned substantially parallel to each other, with the middle structure between the top plate 100 and bottom plate 200. The openings 110 of the top plate 100 are aligned overtop of the raised portions 210 of the bottom plate 200. The support frame 320 is aligned with the network of channels 230 of the bottom plate 200, such that when the top plate 100 is pressed down toward the bottom plate 200, the support frame 320 meshes with the network of channels 230.

Figure 5:
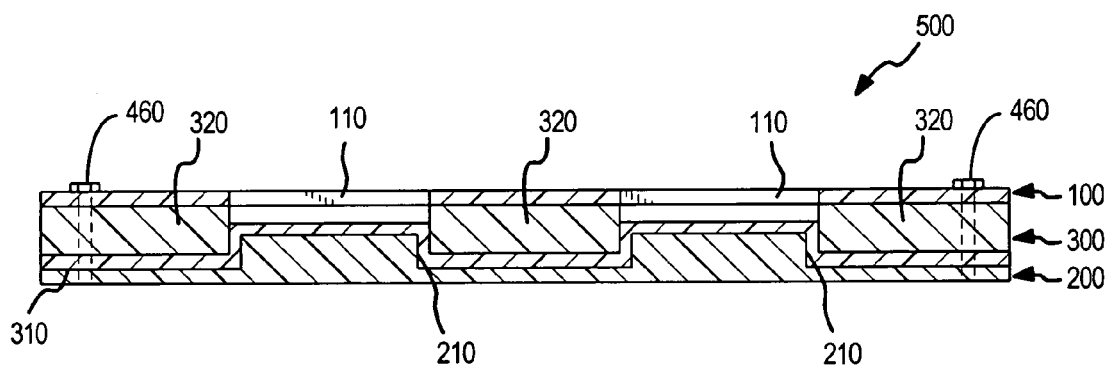
FIG. 5 is a cross-sectional view of the assembled fixture stretching the flexible substrate in accordance with one embodiment of the present invention.
Figure 6:
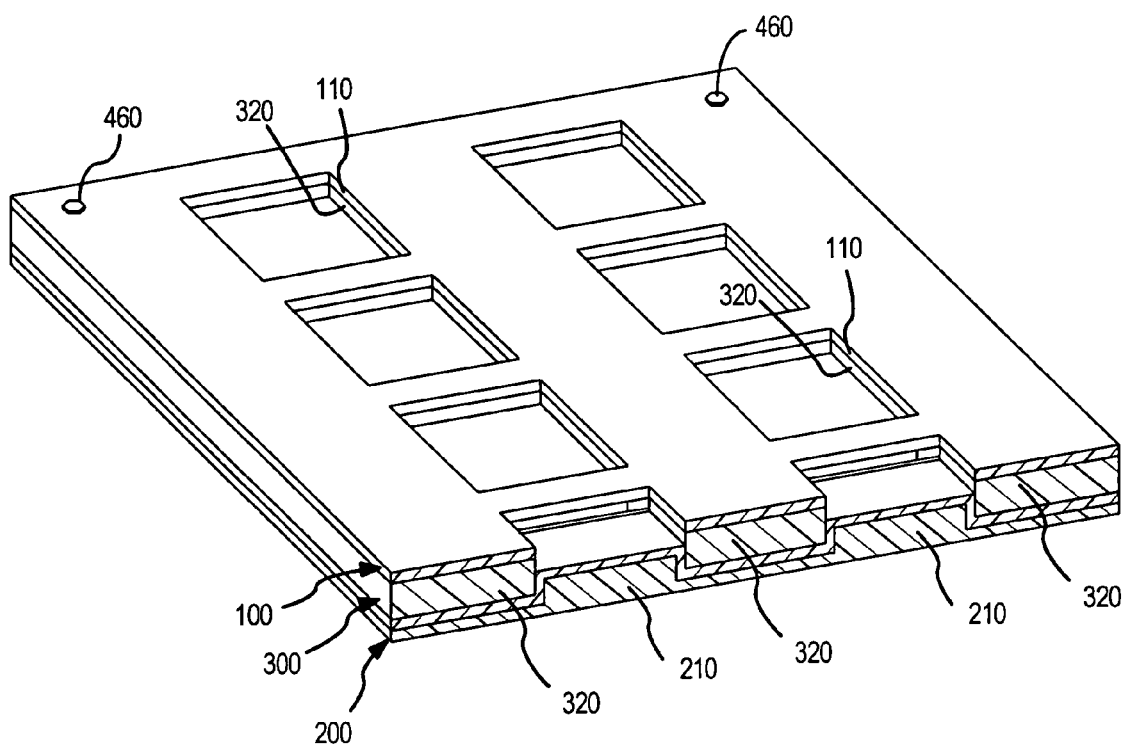
FIG. 6 is a cross-sectional perspective of the assembled fixture of FIG. 5.

In accordance with the particular embodiment illustrated in FIGS. 5–6, the flex film substrate and carrier are sandwiched between to top plate 100 and bottom plate 200. By pressing the plates together, the raised regions of the bottom plate 200 push the flex film substrate upward and around the carrier. By pressing the thin substrate upward, the substrate is stretched like a drum head, thereby flattening the substrate 310. In the embodiments depicted in FIGS. 1–4, each plate has screw holes, 120, 220, and 330, to aid in alignment of the structures and to help facilitate compressing the middle structure 300 between the top plate 100 and the bottom plate 200. In other embodiments, other mechanisms and structures (e.g. clamps) may be used for the alignment and sandwiching of the plates.

Figure 7:
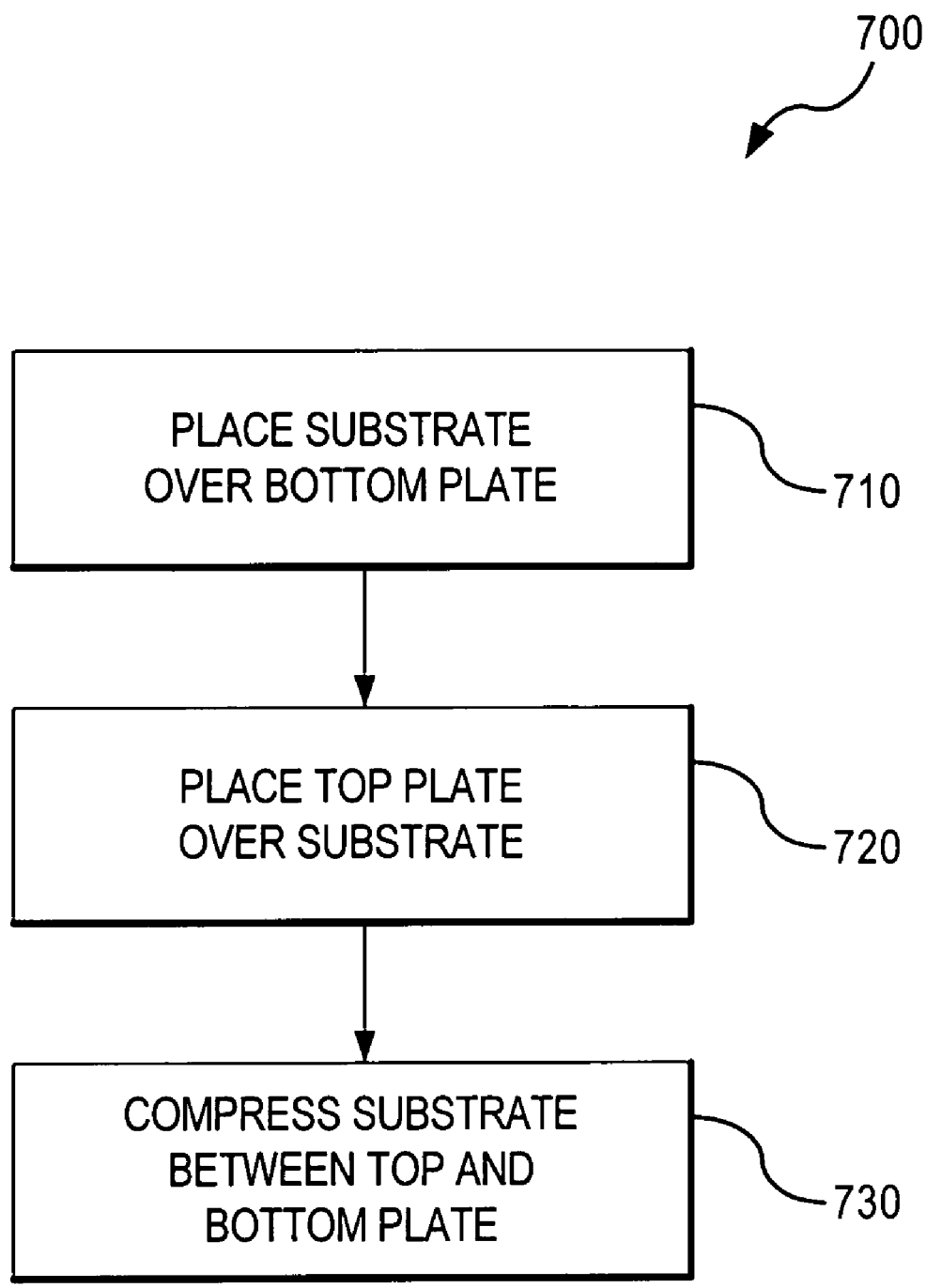
FIG. 7 is a flow diagram illustrating a process of using the assembly fixture in accordance with one embodiment of the present invention.

Having described an exemplary assembly apparatus, a block diagram 700 representing a high level overview of the use according to one embodiment of the present invention will now be described with reference to FIG. 7. At step 710, the middle fixture and substrate are placed over the bottom plate in such a manner that the network of channels in the bottom plate are aligned with the support frame of the middle structure. On top of the middle structure the top plate is aligned in a manner that the openings of the top plate are positioned over the raised sections of the bottom plate at step 720. The substrate is compressed between the top and bottom plate at step 730 causing the substrate to stretch across the raised portions of the bottom plate.

After the flexible substrate is stretched, a die can be assembled by bonding one or more ICs to the flattened substrate through openings in the top carrier using flip chip technologies. In some embodiments, after the ICs are bonded to the thin substrate, the top plate, and the bottom plate are removed and the substrate and IC combination are cut away from the carrier by mechanical separation or through laser cutting process. Thus, all that remains is the thin substrate (<0.001 inches), the integrated circuit (about 0.008 inches), and the solder used to bond the two together (<0.003 inches). The resulting packaged IC can be thinner than an IC constructed with conventional approaches. Additionally, other components such as de-coupling capacitors, small resistors, or other ICs may be bonded in close proximity to the primary IC die to create a multi-chip device or module.

In conclusion, embodiments relate to novel apparatus, methods and arrangements for assembling an IC die by flattening a flexible substrate. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

We claim:

1. A method for creating a flat substrate surface, the method comprising:
   aligning a flexible substrate between a frame and a bottom plate, wherein the bottom plate includes one or more raised sections having channels therebetween, and wherein the frame includes openings facing the raised sections of the bottom plate; and compressing the flexible substrate between the frame and the bottom plate, such that the openings of the frame mesh with the raised sections of the bottom plate, thereby stretching one or more portions of the flexible substrate across the raised sections of the bottom plate.

2. The method of claim 1, wherein compressing comprises:

aligning a top plate above the frame, the top plate having one or more openings aligned with the openings of the frame; and pressing the top plate down upon the frame forming a substrate assembly.

3. The method of claim 1 further comprising:

depositing flux or a conductive media on the flexible substrate through the one or more openings of the top plate;

placing one or more component devices on the flexible substrate of the substrate assembly through one or more associated openings of the top plate;

attaching component device terminations to stretched portions of the flexible substrate using solder; and heating the substrate assembly with attached component devices to form one or more assembled components.

4. The method of claim 3, further comprising separating the one or more assembled components.

5. The method of claim 3, wherein the conductive media is a solder paste.

6. The method of claim 3, wherein the device terminations are subsequent solder bumps.

7. The method of claim 3, further comprising:

the deposition of an underfill or overmold compounds; and curing of said underfill or overmold compounds.

* * * * *